(12) United States Patent
Ueda et al.

(10) Patent No.: US 12,486,575 B2
(45) Date of Patent: Dec. 2, 2025

(54) APPARATUS FOR PROCESSING SUBSTRATE, GAS SHOWER HEAD, AND METHOD FOR PROCESSING SUBSTRATE

(71) Applicant: Tokyo Electron Limited, Tokyo (JP)

(72) Inventors: Hirokazu Ueda, Osaka (JP); Naoki Umeshita, Tokyo (JP); Toshikazu Akimoto, Tokyo (JP); Hiroki Maehara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 114 days.

(21) Appl. No.: 17/954,105

(22) Filed: Sep. 27, 2022

(65) Prior Publication Data

US 2023/0094546 A1    Mar. 30, 2023

(30) Foreign Application Priority Data

Sep. 28, 2021 (JP) ................ 2021-158198

(51) Int. Cl.
*C23C 16/455* (2006.01)
*B05C 11/10* (2006.01)
(Continued)

(52) U.S. Cl.
CPC .... *C23C 16/45565* (2013.01); *B05C 11/1013* (2013.01); *C23C 16/402* (2013.01);
(Continued)

(58) Field of Classification Search
USPC .............. 118/692, 715, 712; 156/345.34
See application file for complete search history.

(56) References Cited

U.S. PATENT DOCUMENTS 6,279,402 B1 * 8/2001 Fisher ............... C23C 16/52
 73/754
6,800,139 B1 10/2004 Shinriki et al.
(Continued)

FOREIGN PATENT DOCUMENTS

JP 2001-077109 A 3/2001
JP 2002-252219 A 9/2002
(Continued)

OTHER PUBLICATIONS

English Translation KR-0183743-B1 (Year: 1999).*
English Translation JP-2013040398-A (Year: 2013).*
English Translation JP-2022089151-A (Year: 2022).*

*Primary Examiner* — Yewebdar T Tadesse
(74) *Attorney, Agent, or Firm* — Fenwick & West LLP

(57) ABSTRACT

An apparatus for processing a substrate by supplying a processing gas to the substrate in a processing container. The apparatus comprises: a mounting table provided in the processing container and for mounting the substrate; a gas shower head comprising a gas diffusion space provided at a position facing the mounting table and for diffusing the processing gas, and a shower plate having a plurality of gas supply holes for supplying the processing gas diffused in the gas diffusion space to the processing container; a gas supply portion provided to supply the processing gas to the gas diffusion space and having a flow rate adjusting portion for the processing gas; a pressure sensor portion provided in the gas diffusion space and to output a pressure signal corresponding to a pressure measurement value in the gas diffusion space; and a controller to output a control signal for adjusting a flow rate of the processing gas.

7 Claims, 6 Drawing Sheets

(51) Int. Cl.
  *C23C 16/40* (2006.01)
  *C23C 16/52* (2006.01)
  *C23C 16/458* (2006.01)

(52) U.S. Cl.
  CPC ........ *C23C 16/45544* (2013.01); *C23C 16/52* (2013.01); *C23C 16/4583* (2013.01)

(56) References Cited

U.S. PATENT DOCUMENTS

| | | |
|---|---|---|
| 2007/0181181 A1 | 8/2007 | Mizusawa |
| 2018/0180509 A1* | 6/2018 | Sawachi ............... C23C 16/455 |
| 2019/0273004 A1* | 9/2019 | Ueda ................. H01L 21/67017 |
| 2020/0157682 A1 | 5/2020 | Sung et al. |
| 2022/0172968 A1* | 6/2022 | Lin ......................... G01F 15/14 |

FOREIGN PATENT DOCUMENTS

| | | | | |
|---|---|---|---|---|
| JP | 2013040398 A * | 2/2013 | | |
| JP | 2015-015466 A | 1/2015 | | |
| JP | 2022089151 A * | 6/2022 | ............. | C23C 16/34 |
| KR | 0183743 B1 * | 4/1999 | | |
| KR | 10-2007-0080824 A | 8/2007 | | |
| KR | 10-2011-0007295 A | 1/2011 | | |
| WO | WO 01/16396 A1 | 3/2001 | | |

* cited by examiner

APPARATUS FOR PROCESSING SUBSTRATE, GAS SHOWER HEAD, AND METHOD FOR PROCESSING SUBSTRATE

CROSS-REFERENCE TO RELATED APPLICATIONS

This application claims priority to Japanese Patent Application No. 2021-158198 filed on Sep. 28, 2021, the entire contents of which are incorporated herein by reference.

TECHNICAL FIELD

The present disclosure relates to an apparatus for processing a substrate, a gas shower head, and a method for processing a substrate.

BACKGROUND

A chemical vapor deposition (CVD) method and an atomic layer deposition (ALD) method are known as processes for performing film formation on a semiconductor wafer (hereinafter referred to as "wafer") in the process of manufacturing a semiconductor device. In this film formation, raw material gases containing film raw materials, reaction gases for oxidizing or reducing the raw material gases, and the like (hereinafter collectively referred to as "film forming gases") are used.

Japanese Laid-open Patent Publication No. 2002-252219 discloses a technique of measuring a pressure by providing a pressure gauge in a shower head in order to efficiently mix raw material gases with a low vapor pressure and supply the mixture to the shower head. Referring to the drawings illustrated in Japanese Laid-open Patent Publication No. 2002-252219, the pressure gauge is provided outside the shower head and is connected to the shower head through a pipe. Japanese Laid-open Patent Publication No. 2015-15466 also discloses that a pressure sensor may be connected to a shower head having a plurality of plenum volumes for use in semiconductor processing equipment.

Further, in addition to film formation, a processing gas is also supplied using a gas shower head in etching, modification, and the like.

SUMMARY

The present disclosure provides a technique for accurately and quickly measuring pressure in a gas shower head.

In accordance with an aspect of the present disclosure, there is provided an apparatus for processing a substrate by supplying a processing gas to the substrate in a processing container, the apparatus comprising: a mounting table provided in the processing container and configured to mount the substrate; a gas shower head comprising a gas diffusion space provided at a position facing the mounting table and configured to diffuse the processing gas, and a shower plate having a plurality of gas supply holes for supplying the processing gas diffused in the gas diffusion space to the processing container; a gas supply portion provided to supply the processing gas to the gas diffusion space and having a flow rate adjusting portion for the processing gas; a pressure sensor portion provided in the gas diffusion space and configured to output a pressure signal corresponding to a pressure measurement value in the gas diffusion space; and a controller configured to output a control signal for adjusting a flow rate of the processing gas to the flow rate adjusting portion based on the pressure measurement value acquired by the pressure sensor portion through the pressure signal.

DETAILED DESCRIPTION

<Film Forming Apparatus>

Figure 1:
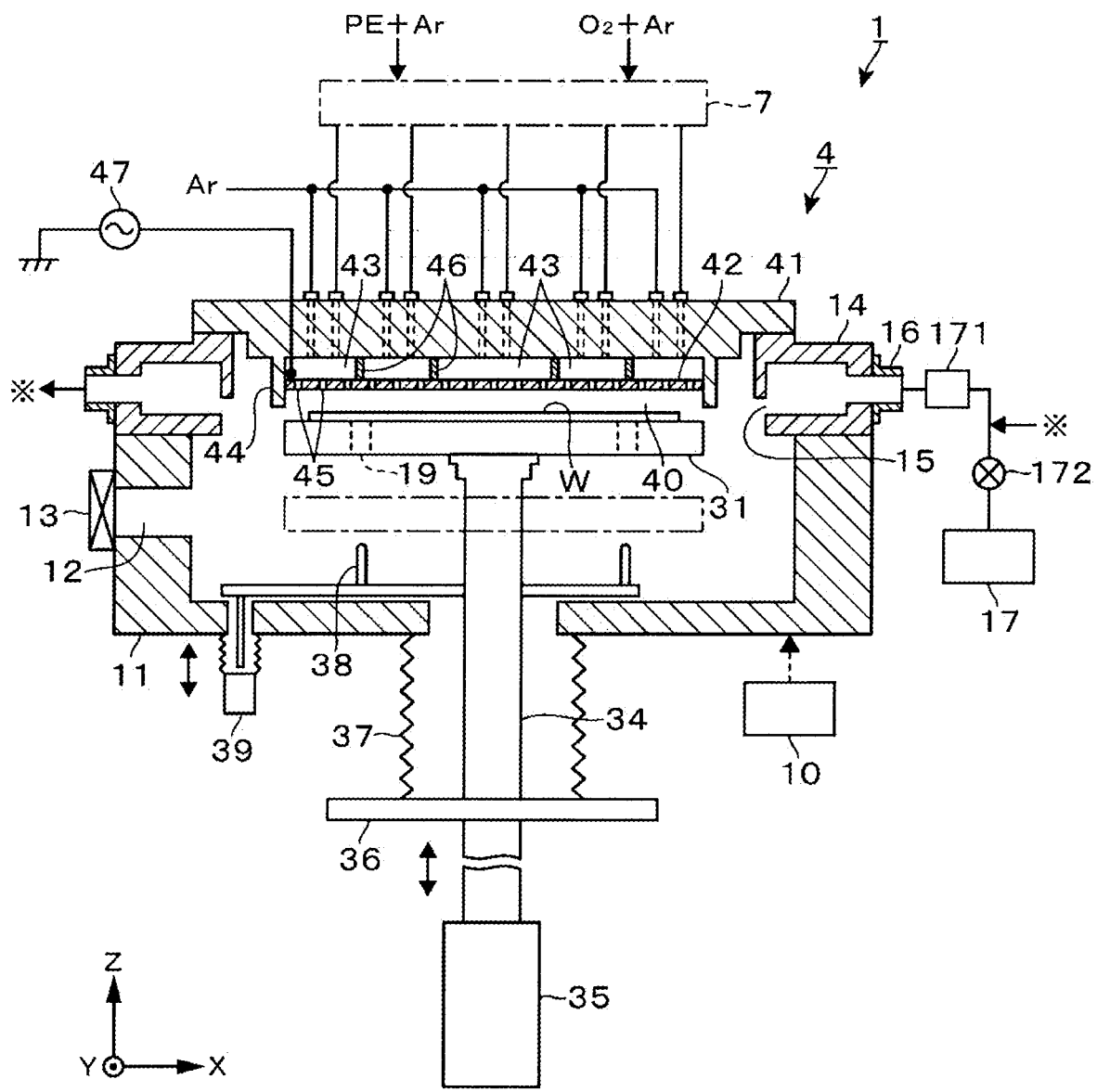
FIG. 1 is a vertical sectional side view of a film forming apparatus according to an embodiment of the present disclosure.

As one embodiment of an apparatus for processing a substrate, a configuration of a film forming apparatus 1 for performing film formation as a substrate processing on a wafer W which is a substrate will be described with reference to FIGS. 1 to 6. The film forming apparatus 1 is configured to supply a film forming gas as a processing gas to a processing container 11 in which the wafer W is accommodated and processed, and form a film by using an atomic layer deposition (ALD) method.

In the ALD method, the film formation is performed by alternately supplying a raw material gas and a reaction gas, which are film forming gases, repeatedly multiple times. In the following example, a case of forming a silicon oxide ($SiO_2$) film on the wafer W will be described.

Examples of the raw material gas containing raw materials (precursors) of the $SiO_2$ film include gases such as $Si_2Cl_6$, $Si_2H_6$, HCDS (hexachlorodisilane), TDMAS (tridimethylaminosilane), and BDEAS (bisdiethylaminosilane).

Further, as the reaction gas for obtaining the $SiO_2$ film by reacting with the raw material, an oxidation gas such as oxygen (O2) gas or ozone (O3) gas can be exemplified. The reaction gas, for example, an O2 gas, is converted into plasma and supplied to the wafer W, and the film forming apparatus 1 is configured as a plasma ALD apparatus.

In addition, the reaction gas is not limited to an example of the oxidation gas (O2 gas or O3 gas)) for obtaining an oxide film (SiO2 film in the above example). A suitable reaction gas is selected according to the film to be formed on the wafer W and the content of the reaction with the raw material gas. For example, when obtaining silicon nitride, nitrogen (N2) gas or ammonia (NH3) gas may be selected. Also, converting the reaction gas into plasma is not an essential requirement. For example, film formation may be performed by thermal reaction on the surface of the heated wafer W.

The processing container 11 of this example is formed in a substantially flat circular shape, and is provided with a loading/unloading port 12 for a wafer and a gate valve 13 for opening and closing the loading/unloading port 12 on its side wall. An exhaust duct 14 forming a part of the side wall of the processing container 11 is provided above the loading/ unloading port 12. A slit-shaped opening 15 extending in the circumferential direction is formed on the inner peripheral surface of the exhaust duct 14. The opening 15 constitutes an exhaust port of the processing container 11. One end of an exhaust pipe 16 is connected to the exhaust duct 14, and the other end of the exhaust pipe 16 is connected to an exhaust device 17 comprising a vacuum pump via a pressure adjusting mechanism 171 and a valve 172.

A disk-shaped mounting table 31 for horizontally mounting the wafer W is provided in the processing container 11. A heater for heating the wafer W and a grounded electrode plate can be embedded in the mounting table 31. Illustration of the heater and the electrode plate is omitted.

An upper end of a rod-shaped supporting member 34 extending vertically through a bottom portion of the processing container 11 is connected to a central portion of a lower surface of the mounting table 31. A lower end of the supporting member 34 is connected to an elevating mechanism 35. The elevating mechanism 35 allows the mounting table 31 to move up and down between a lower position indicated by a dashed-dotted line in FIG. 1 and an upper position indicated by a solid line in FIG. 1. The lower position is a transfer position for transferring the wafer W to and from a transfer mechanism (not shown) for the wafer W entering the processing container 11 through the loading/unloading port 12. In addition, the upper position is a processing position where film formation on the wafer W is performed.

A reference numeral 36 in FIG. 1 denotes a flange, and a reference numeral 37 denotes a telescopic bellows. In addition, a reference numeral 38 in FIG. 1 denotes supporting pins for the wafer W, and for example, three supporting pins 38 are provided (only two of them are shown in the FIG. 1). In addition, a reference numeral 39 in FIG. 1 denotes an elevating mechanism for elevating the supporting pins 38. When the mounting table 31 is positioned at the transfer position, the supporting pins 38 are raised and lowered through through holes 19 provided in the mounting table 31, and the supporting pins 38 protrude from the upper surface of the mounting table 31. By this operation, the wafer W can be transferred between the mounting table 31 and the transfer mechanism.

<Gas Shower Head>

A gas shower head 4 is provided on the exhaust duct 14 at a position facing the wafer W mounted on the mounting table 31. The gas shower head 4 in this example includes a top plate member 41 provided so as to close an opening formed on the upper surface side of the processing container 11, and a shower plate 42 provided on the lower surface side of the top plate member 41. The shower plate 42 is formed in a disk shape and is arranged so as to face the mounting table 31.

A flat gas diffusion space 43 is formed between the top plate member 41 and the shower plate 42 for diffusing the film forming gas therein. A large number of gas discharge holes 45 are dispersedly formed in the shower plate 42, and the processing gas diffused in the gas diffusion space 43 can be supplied into the processing container 11.

Figure 2:
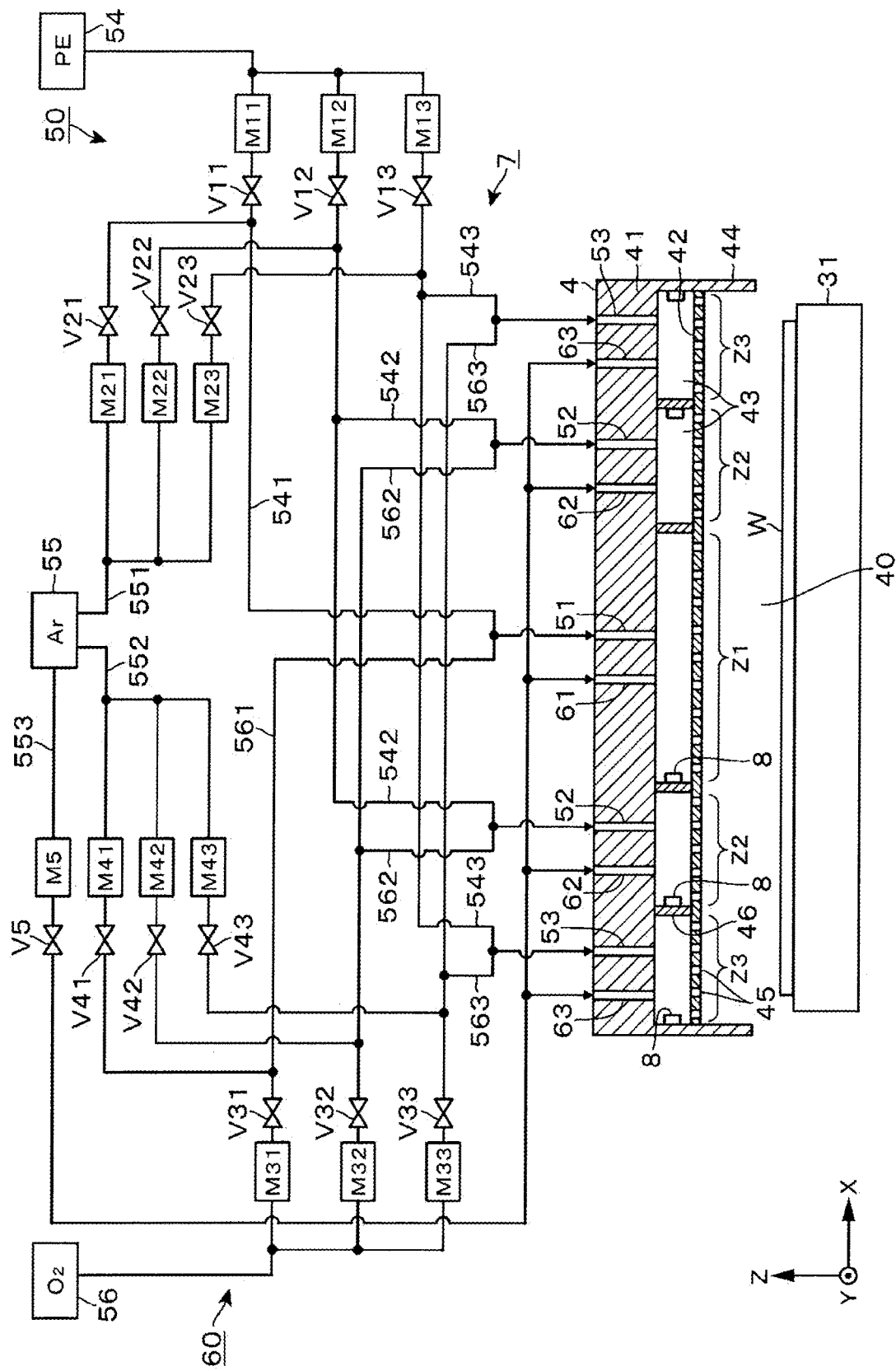
FIG. 2 is an enlarged vertical sectional view of a gas shower head according to an embodiment and a structural view of a supply control device of gas.

As shown in FIGS. 1 and 2, in this example, the peripheral edge of the shower plate 42 is supported by an annular protrusion 44 protruding downward from the lower surface of the top plate member 41. The lower end of the annular protrusion 44 protrudes to a position close to the upper surface at a peripheral edge side of the mounting table 31 located at the processing position.

Figure 3:
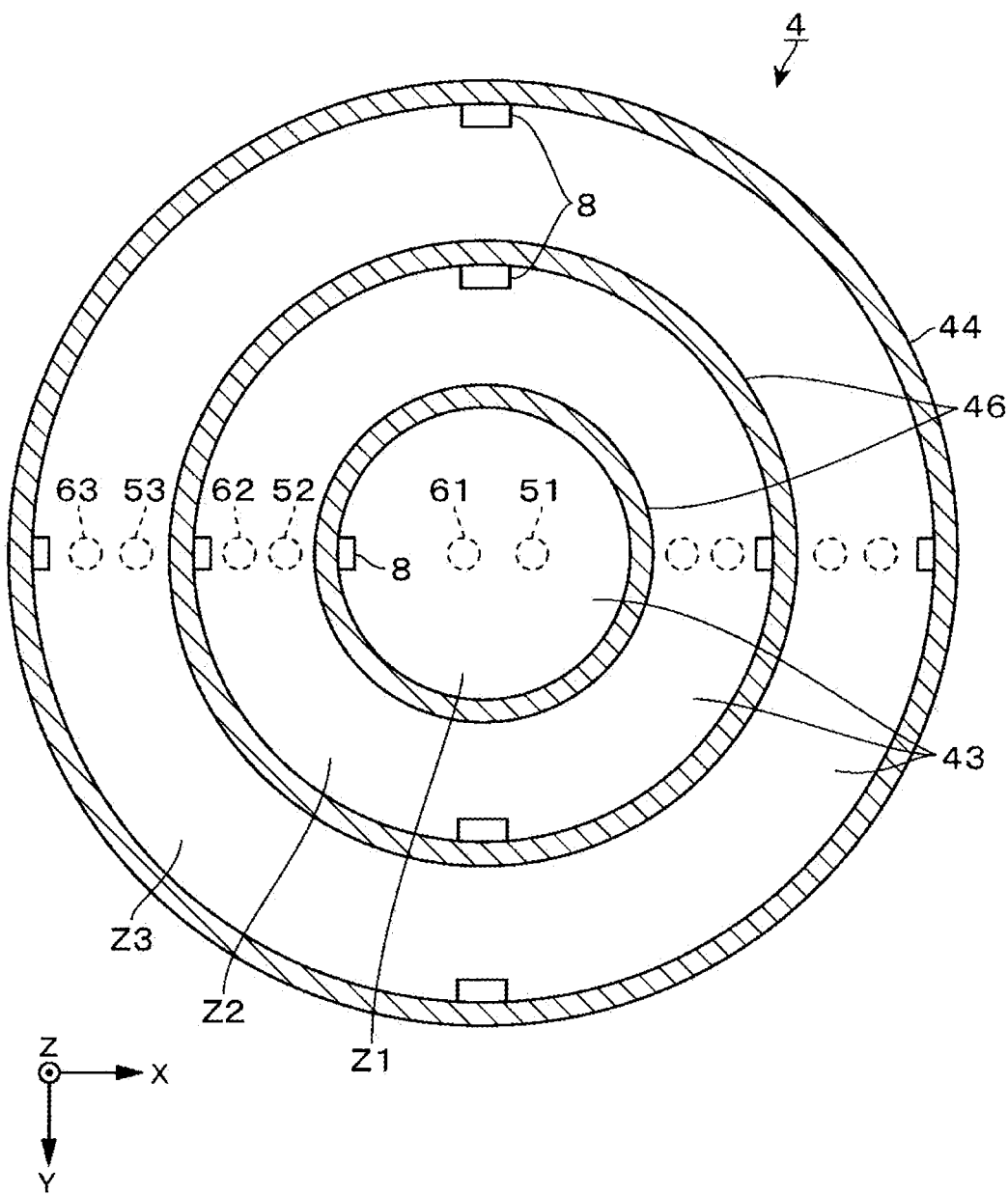
FIG. 3 is a cross-sectional plan view of a gas shower head according to an embodiment.

Further, as shown in FIG. 2, the gas diffusion space 43 of the gas shower head 4 is partitioned into a plurality of spaces by partition walls 46, and has a plurality of partitioned areas Z1 to Z3 through which gas can be discharged from the gas discharge holes 45 independently of each other. As shown in FIG. 3, the gas diffusion space 43 of this example is partitioned into the plurality of spaces in a shape of concentric circles by the partition walls 46 so as to correspond to a radial direction of the wafer W mounted on the mounting table 31.

That is, when viewed from the mounting table 31 side, the arrangement area of the large number of gas discharge holes 45 in the shower plate 42 is partitioned into three partitioned areas (first partitioned area Z1, second partitioned area Z2, and third partitioned area Z3) in the radial direction. In other words, the gas shower head 4 of this example includes a plurality of gas diffusion spaces 43.

In the following description, the gas diffusion spaces 43 partitioned from each other in the gas shower head 4 are also referred to as first to third partitioned areas Z1 to Z3. These first to third partitioned areas Z1 to Z3 are formed by concentrically dividing the shower plate 42, which is circular in plan view. Accordingly, the planar shape of the first partitioned area Z1 is circular, and the planar shapes of the second and third partitioned areas Z2 and Z3 are annular. In addition, the gas diffusion spaces 43 are not limited to being partitioned concentrically, and may be partitioned concentrically in an elliptical or rectangular shape to form these partitioned areas Z1 to Z3.

<Pressure Sensor>

In the gas shower head 4 of this example having the configuration described above, pressure sensors 8 are provided in each of the partitioned areas Z1 to Z3. This example is characterized in that it employs small pressure sensors 8 which measure the pressure inside the partitioned areas Z1 to Z3, which are the gas diffusion spaces 43. This point differs from the conventional pressure measuring method in which pressure gauges provided outside the gas shower head 4 are connected to each of the partitioned areas Z1 to Z3 via connection ports.

The examples shown in FIGS. 2 and 3 show examples in which the pressure sensors 8 are provided on the wall surfaces of the partition walls 46 and the annular protrusions 44 forming the partitioned areas Z1 to Z3. Instead of this example, the configuration may be such that the pressure sensors 8 are provided on the bottom surface of the top plate member 41 forming the ceiling surfaces of the partitioned areas Z1 to Z3.

As shown in FIG. 3, in the gas shower head 4 of this example, one pressure sensor 8 is provided in the central circular first partitioned area Z1. Further, in the annular second and third partitioned areas Z2 and Z3 around the first partitioned area Z1, the pressure sensors 8 are provided respectively at positions where straight lines extending in four directions from the center of each annulus intersect the partition wall 46 and the annular protrusion 44. That is, four pressure sensors 8 are provided in each of the second and third partitioned areas Z2 and Z3.

The configuration of the pressure sensor 8 is not particularly limited as long as it can be arranged in the partitioned areas Z1 to Z3. Examples of the pressure sensor 8 that can be arranged in the partitioned areas Z1 to Z3 include a Pirani gauge 8a or a diaphragm type MEMS (Micro Electro Mechanical Systems) pressure sensor (hereinafter, also referred to as "MEMS sensor") 8b.

Figure 4:
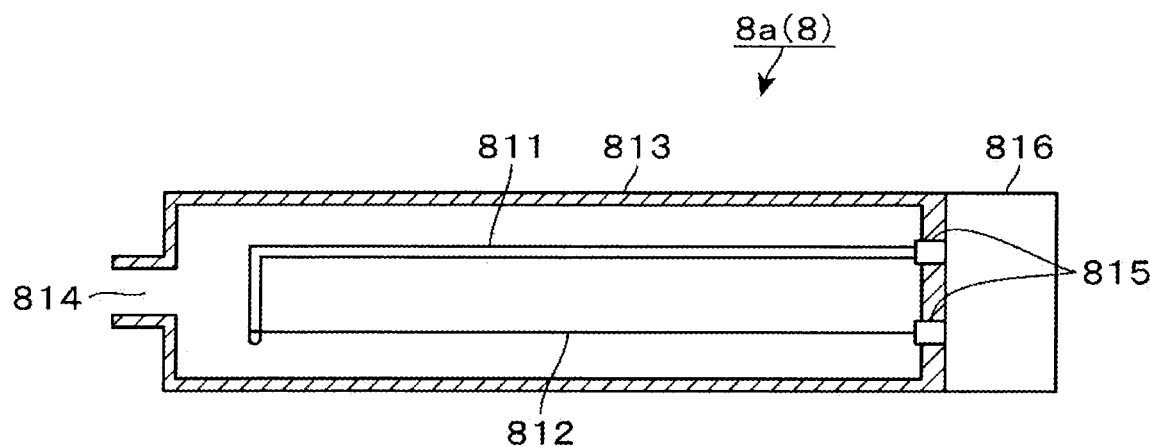
FIG. 4 is a first configuration example of a pressure sensor according to an embodiment.

As shown in a schematic diagram in FIG. 4, the Pirani gauge 8a has a structure in which a platinum filament 812 is stretched along the axial direction of a cylindrical casing 813 having an opening 814 formed at its tip. The platinum filament 812 is held by a holding member 811 made of a conductive metal. In the Pirani gauge 8a, electric power is supplied to the platinum filament 812, and a change in temperature of the platinum filament 812 due to collision of gas molecules is detected as a change in resistance value. Accordingly, the Pirani gauge 8a can detect the pressure in the partitioned areas Z1 to Z3 corresponding to the collision frequency of gas molecules as the resistance value of the platinum filament 812.

Herein, when a film forming gas containing a halogen atom such as $Si_2Cl_6$ described above is supplied as a precursor of the $SiO_2$ film, the platinum filament 812 may be corroded. In such a case, the surfaces of the platinum filament 812 and the holding member 811 may be coated with a thin film of an oxide such as yttria ($Y_2O_3$) to the extent that the reduction in sensitivity is allowed.

In the Pirani gauge 8a of this example, a circuit portion 816 is provided at a base end portion of the casing 813. The circuit portion 816 is provided with a small battery for supplying power to the platinum filament 812, a circuit for detecting the resistance value of the platinum filament 812, a transmission circuit for outputting the detected resistance value as a pressure signal by wireless communication, and the like. In addition, outputting the pressure signal by wireless communication is not an essential configuration, and a configuration in which the pressure signal is output via a signal line may be employed. Further, when power is supplied from a power source provided outside the gas diffusion space 43 via a power supply line or when power is supplied by non-contact power transmission, the arrangement of the battery can be omitted.

In the Pirani gauge 8a, since the temperature of the platinum filament 812 rises with energization, caution is required when using a highly reactive film forming gas. However, since a vacuum atmosphere of several Pa to several hundred Pa is maintained in the partitioned areas Z1 to Z3, there is little possibility of an event in which a rapid reaction of the film forming gas proceeds due to the arrangement of the Pirani gauge 8a.

Figure 5:
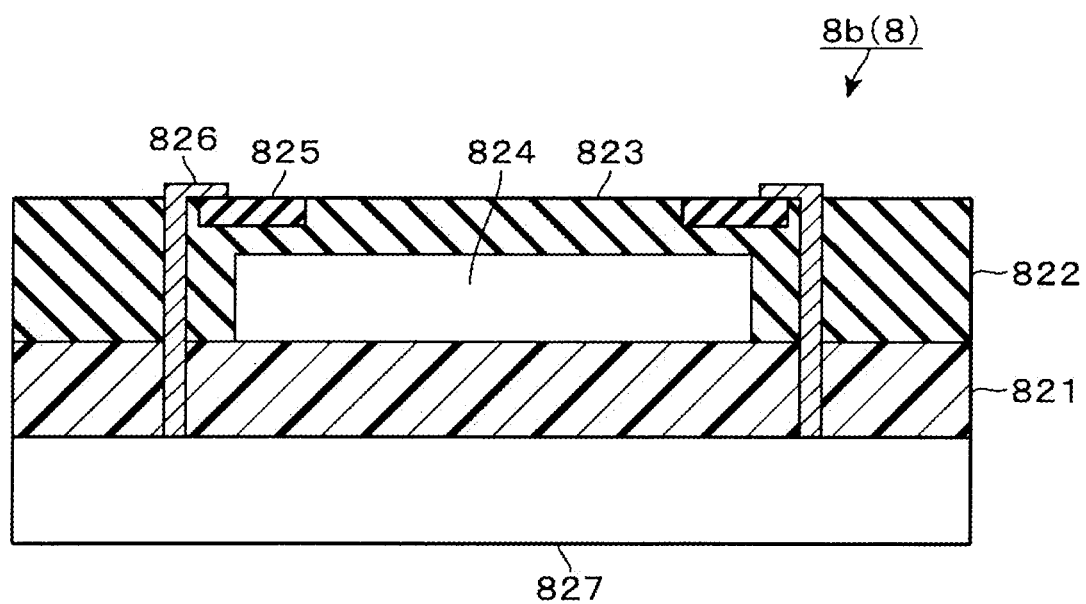
FIG. 5 is a second configuration example of a pressure sensor according to an embodiment.

On the other hand, when using a film forming gas that is highly reactive and requires more careful handling, the diaphragm type MEMS sensor 8b shown in FIG. 5 may be used to measure the pressure.

The MEMS sensor 8b shown in FIG. 5 has a configuration in which, for example, a diaphragm portion 822 made of silicon rubber in which a diaphragm film 823 is arranged via a hollow portion 824 is provided on the upper surface of a base portion 821 made of glass. A strain gauge 825 is arranged in the diaphragm film 823. For example, the strain gauge 825 is composed of a piezoresistive element whose resistance changes with deformation. According to this configuration, when the diaphragm film 823 is deformed due to a change in ambient pressure, the strain gauge 825 is also deformed and the deformation of the strain gauge 825 can be detected as a change in resistance value.

Also in the MEMS sensor 8b of this example, for protection from corrosive film forming gas, the surfaces of the diaphragm portion 822 and the strain gauge 825 may be coated with a thin film of an oxide such as $Y_2O_3$ to the extent that a decrease in sensitivity is allowed.

A circuit portion 827 is connected to the strain gauge 825 via a conductive wire 826. The circuit portion 827 is provided with a small battery for supplying power to the strain gauge 825, a circuit for detecting a resistance value of the strain gauge 825, a transmission circuit for outputting the detected resistance value as a pressure signal by wireless communication, and the like. Also in the MEMS sensor 8b of this example, outputting the pressure signal by wireless communication is not an essential configuration, and a configuration in which the pressure signal is output via a signal line may be employed. Further, as for the method for supplying power, power may be supplied from a power source provided outside the gas diffusion space 43 via a power supply line, or power may be supplied by non-contact power transmission. In these cases, the arrangement of the battery in the circuit portion 827 can be omitted.

High-frequency power may be applied to the gas shower head 4 for plasma formation described later. In such a case, the circuit portions 816 and 827 of the Pirani gauge 8a and the MEMS sensor 8b may have a structure shielded from the high-frequency applied to the gas shower head 4 via an electromagnetic shield. Further, the pressure may be measured and the pressure signal may be output by wireless communication at the timing when the high-frequency for plasma formation is not applied.

In addition, the gas shower head 4 may be provided with a heater for heating the film forming gas. In this case, the pressure sensor 8 (Pirani gauge 8a or MEMS sensor 8b) may be installed on the annular protrusion 44 or the partition wall 46 via a heat insulating member.

<Gas Supply Portion>

The gas shower head 4 is provided with a raw material gas supply portion 50 for supplying a raw material gas and a reaction gas supply portion 60 for supplying an $O_2$ gas which is a reaction gas. The raw material gas supply portion 50 and the reaction gas supply portion 60 constitute a gas supply portion 7 of this example.

From these raw material gas supply portion 50 and reaction gas supply portion 60, the raw material gas and the reaction gas can be independently supplied to each of the partitioned areas Z1 to Z3. In this example, the top plate member 41 of the gas shower head 4 is provided with film forming gas supply paths 51, 52, and 53 for supplying the raw material gas and the reaction gas to each of the partitioned areas Z1 to Z3. Further, purge gas supply paths 61, 62, and 63 for supplying purge gases for purging each of the partitioned areas Z1 to Z3 are formed in the top plate member 41.

Herein, the arrangement numbers of the film forming gas supply paths 51, 52, and 53 and the purge gas supply paths 61, 62, and 63 shown in FIGS. 1 and 2 are examples. Actually, the first to third partitioned areas Z1 to Z3 are provided with a necessary number of the film forming gas supply paths 51, 52, and 53 and the purge gas supply paths 61, 62, and 63. In addition, in FIG. 3, the arrangement positions of the film forming gas supply paths 51, 52, and 53 and the purge gas supply paths 61, 62, and 63 are indicated by broken lines.

The raw material gas (precursor gas) and a carrier gas, and the reaction gas ($O_2$ gas) and a carrier gas are supplied to these film forming gas supply paths 51, 52, and 53 through the gas supply portion 7, respectively.

As shown in FIG. 2, the gas supply portion 7 includes supply paths, valves, flow rate adjusting mechanisms, and the like for the raw material gas, the reaction gas, and the carrier gas. The flow rate adjusting mechanism is composed of, for example, a mass flow controller.

That is, the film forming gas supply paths 51, 52, and 53 are connected to a supply source 54 of the raw material gas (denoted as "PE (Precursor of Example)" in FIGS. 1 and 2) via raw material gas supply paths 541, 542, and 543, respectively. The raw material gas supply paths 541, 542, and 543 are provided with valves V11, V12, and V13 for raw material gas supply/stop operation and flow rate adjusting mechanisms M11, M12, and M13, respectively. Further, the film forming gas supply paths 51, 52, and 53 are also connected to a supply source 55 of Ar gas supplied as the carrier gas via the raw material gas supply paths 541, 542, and 543 and a carrier gas supply path 551, respectively. The carrier gas supply path 551 is provided with valves V21, V22, and V23 for carrier gas supply/stop operation and flow rate adjusting mechanisms M21, M22, and M23, respectively. In addition, the gas used as the carrier gas is not limited to Ar gas. A gas selected from gas species such as Ar, He, Ne, Kr, Xe and $N_2$ can be used singly or in combination.

In addition to these, the film forming gas supply paths 51, 52, and 53 are connected to a supply source 56 of the reaction gas ($O_2$ gas) via reaction gas supply paths 561, 562, and 563, respectively. The reaction gas supply paths 561, 562, and 563 are provided with valves V31, V32, and V33 for reaction gas supply/stop operation and flow rate adjusting mechanisms M31, M32, and M33, respectively. Further, the film forming gas supply paths 51, 52, and 53 are also connected to the supply source 55 of Ar gas supplied as the carrier gas via the reaction gas supply paths 561, 562, and 563 and a carrier gas supply path 552, respectively. The carrier gas supply path 552 is provided with valves V41, V42, V43 for carrier gas supply/stop operation and flow rate adjusting mechanisms M41, M42, and M43, respectively.

In this example, the raw material gas supply portion 50 is composed of the film forming gas supply paths 51, 52, and 53, the raw material gas supply paths 541, 542, and 543, the valves V11, V12, and V13, the flow rate adjusting mechanisms M11, M12, and M13, and the supply source 54 of the raw material gas. In addition, the reaction gas supply portion 60 is composed of the film forming gas supply paths 51, 52, and 53, the reaction gas supply paths 561, 562, and 563, the valves V31, V32, and V33, the flow rate adjusting mechanisms M31, M32, and M33, and the supply source 56 of the reaction gas.

The purge gas supply paths 61, 62, and 63 join, for example, a supply path 553 of the Ar gas on the way and are connected to the supply source 55 of Ar gas supplied as a purge gas via a valve V5 and a mass flow controller M5, respectively. The operation of each valve and flow rate adjusting mechanism is controlled by a controller 10 described later.

In the gas supply portion 7 configured as described above, when supplying the raw material gas to the wafer W, the valves V11, V12, and V13 for supplying the raw material gas are opened. When supplying the reaction gas to the wafer W, the valves V31, V32, and V33 for supplying the reaction gas are opened. When supplying the carrier gas to the wafer W, the valves V21, V22, and V23 or the valves V41, V42, and V43 for supplying Ar gas are opened.

By this operation, the raw material gas or the reaction gas diluted with a predetermined amount of carrier gas is supplied to the first to third partitioned areas Z1 to Z3 of the gas diffusion space 43, respectively, via the raw material gas supply paths 541 to 543 and the film forming gas supply paths 51 to 53. Then, the raw material gas or the reaction gas is discharged into a processing space 40 from the gas discharge holes 45 formed in the partitioned areas Z1 to Z3 of the shower plate 42, respectively.

The raw material gas or reaction gas discharged from the partitioned areas Z1 to Z3 is mainly supplied to an adsorption area of the wafer W located opposite the partitioned areas Z1 to Z3 of the shower plate 42. In other words, a plurality of adsorption areas are formed concentrically along the radial direction in areas facing each of the partitioned areas Z1 to Z3 in the plane of the wafer W.

Accordingly, when the discharge flow rate of the raw material gas per unit area is different among the first to third partitioned areas Z1 to Z3 on the gas shower head 4 side, the flow rate (supply flow rate) of the raw material gas supplied per unit area can be changed among three adsorption areas of the wafer W. Further, when the discharge time of the raw material gas is changed among the first to third partitioned areas Z1 to Z3 on the gas shower head 4 side, the supply time of the raw material gas can be changed among the three adsorption areas on the wafer W.

<Processing Space and Plasma Forming Mechanism>

Returning to FIG. 1, the description is continued. A space surrounded by the lower surface of the shower plate 42, the annular protrusion 44, and the upper surface of the mounting table 31 constitutes the processing space 40 in which the film formation is performed. Further, the shower plate 42 is paired with an electrode plate (not shown) in the mounting table 31, and is configured as an electrode plate for forming capacitively coupled plasma (CCP) in the processing space 40.

A high-frequency power supply 47 is connected to the shower plate 42 via a matching device (not shown). The CCP is formed by supplying high-frequency power from the high-frequency power supply 47 to the gas supplied to the processing space 40 through the shower plate 42. In addition, a high-frequency power supply or a DC power supply for applying bias power to the electrode plate may be provided between the electrode plate of the mounting table 31 and a ground end. Alternatively, instead of the shower plate 42, the high-frequency power supply 47 may be connected to the electrode plate on the mounting table 31 side, and the shower plate 42 may be grounded.

In addition, when film formation is performed without using plasma, the plasma forming mechanism such as the high-frequency power supply 47 and a bias power supply can be omitted.

<Controller>

The film forming apparatus 1 is also provided with the controller 10 comprising a computer. The controller 10 includes a program, a memory, a data processing unit including a CPU, and the like. The program incorporates instructions (steps) for sending control signals from the controller 10 to each component of the film forming apparatus 1 and executing film formation described later. Specifically, the program controls an opening/closing timing of each valve, a flow rate set value of the flow rate adjusting mechanism, an on/off timing of the high-frequency power supply 47, a heating temperature of the wafer W by the heater, and the like. These programs are stored in a storage unit 101 having, for example, a compact disk, a hard disk, an MO (magneto-optical disk), a non-volatile memory, and the like, and are installed in the controller 10.

Figure 6:
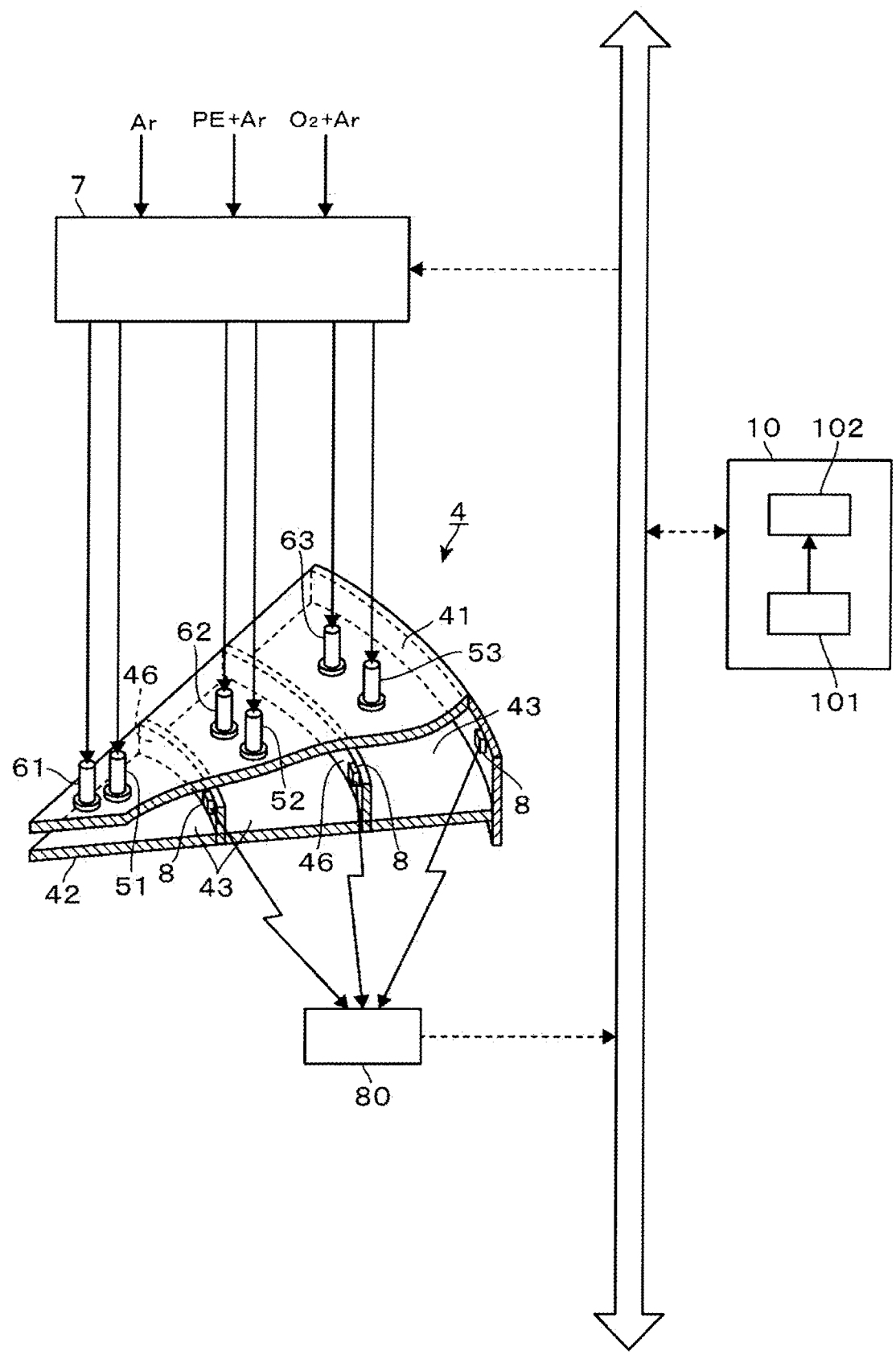
FIG. 6 is a block diagram illustrating an electrical configuration of a film forming apparatus according to an embodiment.

FIG. 6 is a block diagram illustrating an electrical configuration related to a function of performing pressure control of the partitioned areas Z1 to Z3 using the pressure sensor 8. In FIG. 6, the gas shower head 4 is shown in a state in which a part thereof is cut out in a fan shape. Further, for convenience of illustration, pipes connected to the film forming gas supply paths 51, 52, and 53 and the purge gas supply paths 61, 62, and 63 formed in the top plate member 41 of the gas shower head 4 are labeled with reference numerals for identifying each gas supply path.

The controller 10 reads, as parameters, flow rate set values and supply times for each raw material gas, reaction gas, carrier gas, and purge gas set in the recipe stored in the storage unit 101. Then, these parameters are set by a parameter setting unit 102 for each flow rate adjusting portion (the flow rate adjusting mechanism M and an opening/closing operation mechanism of the valve V) in the gas supply portion 7.

Further, the controller 10 can acquire pressure signals output from the pressure sensors 8 in the partitioned areas Z1 to Z3 via a reception portion 80. Then, the controller 10 has a function of comparing each pressure signal with a preset pressure range at a measurement position and correcting the flow rate set value and the supply time of each gas based on the comparison result. From this point of view, it can be said that the controller 10 has a function of outputting a control signal for adjusting the flow rate of each processing gas to each flow rate adjusting portion (the flow rate adjusting mechanisms M11 to M13, M21 to M23, M31 to M33, M41 to M43, and M5, and the opening/closing operation mechanism of valves V11 to V13, V21 to V23, V31 to V33, V41 to V43, and V5) based on the pressure measurement value obtained from the pressure sensor 8.

<Film Formation Operation>

Figure 7:
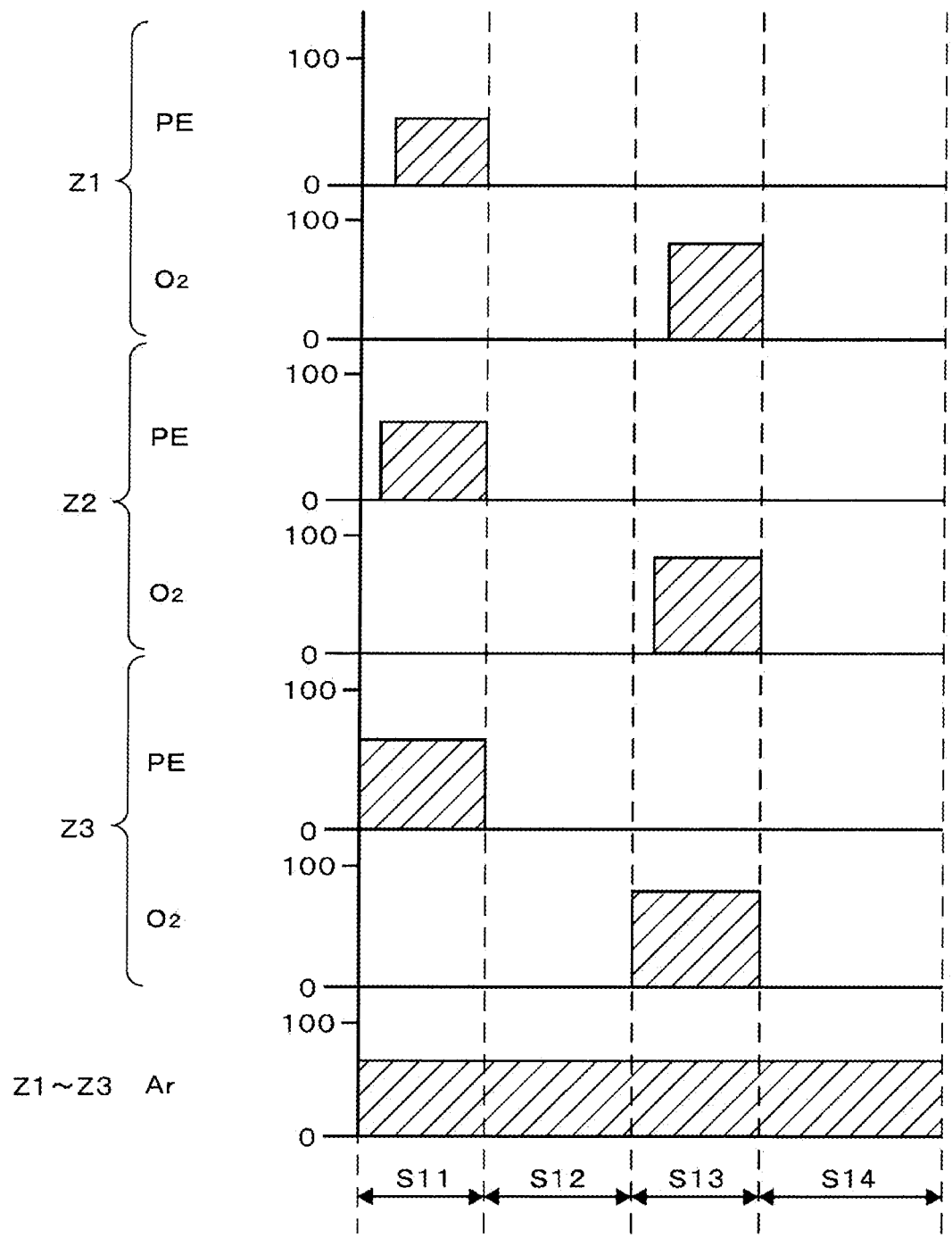
FIG. 7 is an operation view of film formation by an ALD method.

Next, an example of a method for processing a substrate according to the present disclosure, which is performed using the film forming apparatus 1, will be described with reference to FIG. 7 as well. The horizontal axis of each chart shown in FIG. 7 represents the passage of time in one cycle, and the vertical axis represents the flow rate set value of each flow rate adjusting mechanism (M11 to M13, M31 to M33, M21 to M23, M41 to M43, and M5) expressed in 100% range. However, since the flow rate set values of the flow rate adjusting mechanisms M21 to M23, M41 to M43, and M5 all show an example in which Ar gas is continuously supplied, these set values are collectively described in one chart.

When the wafer W to be processed is transferred from an external vacuum transfer chamber, the gate valve 13 is opened, and the transfer mechanism (not shown) holding the wafer W enters the processing container 11 through the loading/unloading port 12. Then, the supporting pins 38 are lifted, and the wafer W is received above the mounting table 31 waiting at the transfer position. Thereafter, the transfer mechanism is withdrawn from the processing container 11, the supporting pins 38 are lowered, and the wafer W is mounted on the mounting table 31 (a process of mounting the substrate).

Next, the gate valve 13 is closed and the mounting table 31 is lifted to the processing position. Further, the pressure inside the processing container 11 and the temperature of the wafer W are adjusted. As shown in FIG. 7, Ar gas is continuously supplied as purge gas to each of the partitioned areas Z1 to Z3, and the pressure inside the processing container 11 can be adjusted by adjusting the exhaust amount.

Next, the film formation on the wafer W is started by the ALD method. The film formation sequence by the ALD method will be described with reference to the chart in FIG. 7. The chart in FIG. 7 shows the timing of supply/stop of various gases into the processing container 11 (that is, the supply time) and the flow rate set values in each of the partitioned areas Z1 to Z3.

In the ALD method, the film formation is performed by repeating a cycle of the supply of the raw material gas→the discharge of the raw material gas by the purge gas→the supply of the reaction gas and the plasma formation→the discharge of the reaction gas by the purge gas a plurality of times. FIG. 7 shows the film formation sequence for one cycle.

In the gas supply portion 7, the valves V21 to V23 and V41 to V43 are opened to continuously supply Ar gas from the supply source 55 to the processing space 40 via the gas shower head 4. Further, the valve V5 is opened to continuously supply Ar gas via each of the purge gas supply paths 61, 62, and 63 as well. Subsequently, the valves V11 to V13 are opened to supply the raw material gas from the supply source 54. The raw material gas flows into each of the partitioned areas Z1 to Z3 using Ar gas as a carrier gas, and then is discharged into the processing space 40 through the gas discharge holes 45 of the shower plate 42. In this way, the raw material gas is supplied to the wafer W, and the precursor is adsorbed on the surface of the wafer W (step S11).

Herein, in the gas shower head 4, the gas diffusion space 43 is partitioned into the first to third partitioned areas Z1 to Z3, and the gas supply portion 7 is provided with the flow rate adjusting mechanisms M11, M12, and M13 for adjusting the amount of the raw material gas supplied to each of the partitioned areas Z1 to Z3. With this configuration, the supply time and supply flow rate of the raw material gas to the wafer W can be made different among the partitioned areas Z1 to Z3. FIG. 7 shows an example in which the timing of starting the supply of the raw material gas and the supply flow rate are different among the partitioned areas Z1 to Z3.

By these flow rate adjustments, it is possible to independently adjust the amount of raw material gas adsorbed to the plurality of adsorption areas formed according to the partitioned areas Z1 to Z3. It can be said that switching between supply and stop of the raw material gas means that the flow rate is adjusted between a state where the supply flow rate is larger than zero (supply) and a state where the supply flow rate is zero (stop).

Subsequently, the valves V11 to V13 are closed to stop the supply of the raw material gas to the wafer W. On the other hand, the supply of Ar gas is continued while the valves V21 to V23, V41 to V43, and V5 are kept open, so that the raw material gas remaining in the processing space 40 and not adsorbed on the wafer W is purged with Ar gas (Step S12). In this way, the raw material gas supply portion 50 supplies a mixed gas of the Ar gas which is the carrier gas and the raw material gas during the supply period of the raw material gas, and continues to supply the Ar gas during the period in which the supply of the raw material gas is stopped. As a result, the raw material gas and the reaction gas are prevented from flowing back to the film forming gas supply paths 51 to 53, the raw material gas supply paths 541 to 543, and the reaction gas supply paths 561 to 563.

Next, the valves V31 to V33 are opened to supply the reaction gas from the supply source 56 of the reaction gas. After flowing into each of the partitioned areas Z1 to Z3 together with the Ar gas which is the carrier gas, the reaction gas is discharged into the processing space 40 through the gas discharge holes 45 of the shower plate 42. Further, during the supply period of the $O_2$ gas which is the reaction gas, high-frequency power is applied from the high-frequency power supply 47 to the shower plate 42 to turn the $O_2$ gas into plasma. This plasma oxidizes the precursor adsorbed on the wafer W, forming a layer of $SiO_2$ as a reaction product (step S13).

The flow rate adjusting mechanisms M31, M32, and M33 are provided for adjusting the amount of reaction gas supplied to each of the partitioned areas Z1 to Z3 even during the supply period of the reaction gas. With this configuration, the supply time and supply flow rate of the reaction gas to the wafer W can be made different among the partitioned areas Z1 to Z3. FIG. 7 shows an example in which the timings of starting the supply of the reaction gas and the supply flow rates are different among the partitioned areas Z1 to Z3.

By these flow rate adjustments, it is possible to independently adjust the flow rates of the reaction gas supplied to the plurality of adsorption areas formed according to the partitioned areas Z1 to Z3.

Thereafter, the application of the high-frequency power to the shower plate 42 is stopped, the valves V31 to V33 are closed, and the formation of plasma and the supply of the reaction gas in the processing space 40 are stopped. On the other hand, the supply of Ar gas is continued while the valves V21 to V23, V41 to V43, and V5 are kept open and, thereby purging the reaction gas and the active species of plasma remaining in the processing space 40 with Ar gas (step S14). In this manner, the reaction gas supply portion 60 supplies the mixed gas of Ar gas, which is the carrier gas, and the reaction gas during the supply period of the reaction gas, and continues to supply Ar gas during the period when the supply of the reaction gas is stopped. As a result, the precursor and the reaction gas are prevented from flowing back to the film forming gas supply paths 51 to 53, the raw material gas supply paths 541 to 543, and the reaction gas supply paths 561 to 563.

By repeating the film formation sequence described above a preset number of times, a film (an SiO$_2$ film in this example) having a desired thickness can be formed on the surface of the wafer W (a process of supplying the processing gas into the processing container 11). Further, it is also possible to adjust the film thickness distribution of the film formed on the wafer W by independently adjusting the supply time and the supply flow rate of the raw material gas and the reaction gas among the plurality of partitioned areas Z1 to Z3.

In the example described above, the gas supply portion 7 can be used to control the flow rate set value of the flow rate adjusting mechanisms M11, M12, M13, M31, M32, and M33 provided on an upstream side of each of the partitioned areas Z1 to Z3 and the supply time of the raw material gas and the reaction gas.

At this time, from each of the partitioned areas Z1 to Z3, it is possible to confirm that the supply flow rate of the film forming gas and the purge gas required to obtain a desired film thickness distribution is ensured for each adsorption area on the wafer W side by preliminary experiments, fluid simulations, and the like. However, in the actual operation of the film forming apparatus 1, it may be necessary to adjust other parameters affecting the supply flow rate of gas, such as adjusting the pressure in the processing container 11, if necessary. At this time, it is not realistic to predict all the possibilities of changing these other parameters, perform preliminary experiments and simulations, and exhaustively specify the flow rate set value and supply time of each gas in the gas supply portion 7.

Further, in the film formation by the ALD method developed by the applicant, it may be required to switch steps S11 to S14 shown in FIG. 7 at intervals of, for example, 1 second or less, and under stricter condition, about 0.2 to 0.5 seconds. When switching is performed at such extremely short intervals, the next step will start before the gas flow in each step reaches a steady state. Such an unsteady state may make it difficult to accurately specify the flow rate by preliminary experiments or simulations.

Accordingly, as described with reference to FIGS. 1 to 6, the film forming apparatus 1 of this example includes the small pressure sensors 8 for measuring the pressure inside each of the partitioned areas Z1 to Z3. These pressure sensors 8 measure the pressure in each of the partitioned areas Z1 to Z3 and output pressure signals corresponding to the pressure measurement value (a process of outputting the pressure signals). For example, based on the result of pressure measurement, the controller 10 can determine whether or not the pressure in each of the partitioned areas Z1 to Z3 is within the pressure range that is the premise of setting these parameters by the operation based on the flow rate set value and the supply time set for the gas supply portion 7.

In addition, when the pressures in the partitioned areas Z1 to Z3 are out of a preset pressure range, it can be understood that the supply flow rate of the gas supplied toward the adsorption areas on the wafer W side at that time deviates from the supply flow rate assumed at the time of parameter setting. Accordingly, the controller 10 corrects the flow rate set value and the supply time for the parameters related to the supply of the gas deviated from the pressure range through the parameter setting unit 102 (a process of adjusting the flow rate of the processing gas). By this correction, an actual flow rate of the gas supplied to the adsorption areas of the wafer W can be brought closer to the supply flow rate for obtaining the desired film thickness distribution.

To give a specific example based on the example of FIG. 7, for example, it is assumed that, during the period of step S11, the pressure measured by the pressure sensor 8 provided in the second partitioned area Z2 is higher than the preset pressure range. In this case, in the next cycle or when the next wafer W is processed, the timing of starting the supply of the raw material gas may be delayed to shorten the time during which the raw material gas is supplied. Further, in the case of performing real-time control in which the control is completed within step S11 in which pressure measurement is performed, the timing of stopping the supply of the raw material gas can be advanced to shorten the supply time of the raw material gas. In addition, the supply flow rate of the raw material gas may be reduced by lowering the flow rate set value of the flow rate adjusting mechanism M12 for the raw material gas supplied toward the second partitioned area Z2. The flow rate set value of the flow rate adjusting mechanism M12 may be adjusted in the next cycle or when the next wafer W is processed, or may be changed while measuring the pressure in step S11.

As another example, for example, it is assumed that, during the period of step S12, the pressure measured by the pressure sensor 8 provided in the third partitioned area Z3 is lower than the preset pressure range. In this case, in the next cycle or when the next wafer W is processed, the supply flow rate of the Ar gas supplied as the carrier gas to the third partitioned area Z3 may be increased to replenish the supply amount of the purge gas during the period of step S12. Alternatively, the flow rate set value of the Ar gas may be increased while measuring the pressure in step S12.

In this way, by measuring the pressures in the partitioned areas Z1 to Z3 using the pressure sensors 8, it is possible to more accurately control the supply of the film forming gas and the purge gas.

After repeating steps S11 to S14 described above for a preset number of times, the mounting table 31 is lowered, the wafer W is unloaded from the processing container 11 in the reverse order of the loading operation, and the film formation on the wafer W is completed.

The film forming apparatus 1 according to the embodiment described above has the following effects. The pressure in the partitioned areas Z1 to Z3 of the gas shower head 4 can be measured quickly. That is, in the gas shower head 4, sensing portions of the pressure sensor 8 (the platinum filament 812 of the Pirani gauge 8*a*, and the diaphragm film 823 and the strain gauge 825 of the MEMS sensor 8*b*) are provided inside each of the partitioned areas Z1 to Z3. With this configuration, it is possible to more directly measure the pressure in the partitioned areas Z1 to Z3 on the spot, and accurate and rapid pressure measurement can be performed.

Herein, as a method for measuring the pressure in the partitioned areas Z1 to Z3, a method of connecting a pressure gauge arranged outside the gas shower head 4 to the inside of the partitioned areas Z1 to Z3 via a connection port may be considered. However, as described above, when the gas supplied to each of the partitioned area Z1 to Z3 is switched one after another in a short time of 1 second or less, an external pressure gauge connected via the connection port has a slow response. As a result, it may not be possible to obtain a resolution of the pressure measurement value that can identify the change in pressure in each of steps S11 to S14.

In this respect, the pressure sensors 8 provided in the gas diffusion space 43 corresponding to the partitioned areas Z1 to Z3 directly measure the pressure in the partitioned areas Z1 to Z3 without using the connection port, so that the pressure can be measured quickly and accurately. As a result, it can be used for more accurate gas supply control in response to gas switching in a short time during film formation by the ALD method.

<Variation>

In the examples shown in FIGS. 1 to 3, the configuration has been described in which the plurality of gas diffusion spaces 43 (first to third partitioned areas Z1 to Z3) are provided, and one or more pressure sensors 8 are provided in each of these partitioned areas Z1 to Z3. At this time, it is not an essential requirement to provide one or more pressure sensors 8 in all of the plurality of gas diffusion spaces 43. If necessary, one or more pressure sensors 8 may be provided for some of the plurality of gas diffusion spaces 43.

Further, the number of gas diffusion spaces 43 provided in the film forming apparatus 1 (gas shower head 4) is not limited to plural. For example, one or more pressure sensors 8 are arranged in the gas diffusion space 43 formed only one for the gas shower head 4, and based on the result of measuring the pressure measurement value, the supply of the film forming gas and the purge gas may be controlled.

Further, the method in which the controller 10 adjusts the flow rates of the film forming gas and the purge gas based on the result of obtaining the pressure measurement value in the gas diffusion space 43 from the pressure sensors 8 is not limited to parameter (flow rate set value, and supply time) correction using the parameter setting unit 102. For example, a flow rate control valve may be provided on the supply path 553 side of Ar gas to continuously adjust the flow rate of Ar gas so that the pressures in the partitioned areas Z1 to Z3 are maintained within a preset pressure range.

In addition, the method of performing film formation using the film forming apparatus 1 is not limited to the ALD method described with reference to FIG. 7. For example, the pressure sensor 8 may be provided for the gas diffusion space 43 of the film forming apparatus 1 which performs film formation using the CVD method by continuously supplying the raw material gas alone or continuously supplying the raw material gas and the reaction gas in parallel.

The gas shower head 4 provided with the pressure sensor 8 in the gas diffusion space 43 is not limited to application to the film forming apparatus 1 for performing film formation on the wafer W. The pressure sensor 8 may be provided in the gas shower head 4 which supplies gas into the processing container 11 of an etching processing apparatus which supplies an etching gas to the wafer W to etch a film formed on the wafer W or a reforming apparatus which performs a reforming process for reforming a substance on the wafer W with a reforming gas. In these cases, the etching gas and the reforming gas correspond to the processing gas of the present disclosure, respectively.

In particular, an apparatus for performing an etching processing includes an ALE apparatus which performs ALE (Atomic Layer Etching) for etching atomic layers of a target film layer by layer. The ALE apparatus alternately repeats a process of performing chemical modification by supplying a modifying gas that acts only on the atomic layer on the outermost surface of the wafer, and a process of etching for removing only the chemically modified portion. The supply of the modifying gas and the etching gas in ALE requires high-precision flow rate adjustment in a short time, as in film formation by the ALD method. Accordingly, a configuration in which the pressure sensor 8 is provided in the gas shower head 4 for supplying these modifying gas and etching gas as the processing gas to measure the pressure and adjust the supply flow rate based on the measurement result is one of the particularly preferred embodiments.

Furthermore, the method of providing the pressure sensor 8 in the gas diffusion space 43 can be used for other than when the wafer W is processed. For example, when developing the gas shower head 4 and measuring the pressure in the gas diffusion space 43 as basic data, the pressure sensor 8 may be provided in the gas diffusion space 43. Even when performing a case study of the volume of the gas diffusion space 43 and the number and arrangement of the gas discharge holes 45 formed in the shower plate 42, by using the pressure measured in the gas diffusion space 43, it is possible to accurately grasp the current situation.

It should be considered that the embodiments disclosed this time are illustrative in all respects and not restrictive. The embodiments described above may be omitted, replaced, or modified in various ways without departing from the scope and spirit of the appended claims.

What is claimed is:

1. An apparatus for processing a substrate by supplying a processing gas to the substrate provided in a processing space in a processing container, the apparatus comprising:
   a mounting table provided in the processing container and configured to mount the substrate;
   a gas shower head comprising a gas diffusion space provided at a position facing the mounting table and configured to diffuse the processing gas, and a shower plate having a plurality of gas supply holes for supplying the processing gas diffused in the gas diffusion space to the processing space;
   a gas supply portion provided to supply the processing gas to the gas diffusion space and having a flow rate adjusting portion for the processing gas;
   a pressure sensor portion disposed inside of the gas diffusion space and configured to output a pressure signal corresponding to a pressure measurement value in the gas diffusion space; and
   a controller configured to output a control signal for adjusting a flow rate of the processing gas to the flow rate adjusting portion based on the pressure measurement value acquired by the pressure sensor portion through the pressure signal,
   wherein the gas shower head comprises a plurality of the gas diffusion spaces partitioned from each other by partition walls, the pressure sensor portion comprises a plurality of pressure sensors provided on the partition walls and each of the pressure sensors is disposed inside of a respective one of the plurality of the gas diffusion spaces, each of the gas diffusion spaces has the gas supply holes for supplying the processing gas diffused in each gas diffusion space to the processing space, the gas supply portion comprises a plurality of the flow rate adjusting portions for adjusting the flow rate of each of the processing gases supplied to the plurality of the gas diffusion spaces, and the controller outputs the control signal to the flow rate adjusting portion for adjusting the flow rate of the processing gas supplied to the gas diffusion space provided with each of the pressure sensors based on the pressure measurement values acquired from the plurality of the pressure sensors.

2. The apparatus of claim 1, wherein the gas supply portion supplies a film forming gas for performing a film formation on the substrate as the processing gas.

3. The apparatus of claim 2, wherein the gas supply portion is configured to switch and repeatedly supply, as the film forming gas, a raw material gas containing a raw material of a film to be formed on the substrate and a reaction gas for reacting with the raw material to obtain the film, and in the switching, to supply a purge gas for purging the gas diffusion space after stopping the supply of the raw material gas or the reaction gas.

4. The apparatus of claim 1, wherein each of the pressure sensors comprised in the pressure sensor portion has a wireless communication function and outputs the pressure signal by wireless communication.

5. A gas shower head for supplying a processing gas to a substrate on which a substrate processing is performed, the gas shower head comprising:

a shower plate having a gas diffusion space for diffusing the processing gas supplied from outside and a plurality of gas supply holes for supplying the processing gas diffused in the gas diffusion space; and a pressure sensor portion disposed inside of the gas diffusion space and configured to output a pressure signal corresponding to a pressure measurement value in the gas diffusion space, wherein the gas shower head includes a plurality of the gas diffusion spaces partitioned from each other by partition walls, the pressure sensor portion comprises a plurality of pressure sensors provided on the partition walls and each of the pressure sensors is disposed inside of a respective one of the plurality of the gas diffusion spaces, and each of the gas diffusion spaces has the gas supply holes for supplying the processing gas diffused in each gas diffusion space.

6. The gas shower head of claim 5, wherein each of the pressure sensors is composed of a Pirani gauge or a diaphragm type MEMS (Micro Electro Mechanical Systems) pressure sensor.

7. The gas shower head of claim 5, wherein each of the pressure sensors comprised in the pressure sensor portion has a wireless communication function and outputs the pressure signal by wireless communication.

* * * * *